(12) United States Patent
Itoh et al.

(10) Patent No.: US 8,963,344 B2
(45) Date of Patent: Feb. 24, 2015

(54) EPOXY RESIN COMPOSITION FOR SEMICONDUCTOR ENCAPSULATION, CURED PRODUCT THEREOF, AND SEMICONDUCTOR DEVICE

(75) Inventors: Shingo Itoh, Tokyo (JP); Shinichi Zenbutsu, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 65 days.

(21) Appl. No.: 13/514,110

(22) PCT Filed: Nov. 29, 2010

(86) PCT No.: PCT/JP2010/006930
§ 371 (c)(1),
(2), (4) Date: Jun. 6, 2012

(87) PCT Pub. No.: WO2011/070739
PCT Pub. Date: Jun. 16, 2011

(65) Prior Publication Data
US 2012/0261807 A1    Oct. 18, 2012

(30) Foreign Application Priority Data
Dec. 7, 2009  (JP) ................ P2009-277461

(51) Int. Cl.
*H01L 23/29* (2006.01)
*H01L 23/31* (2006.01)
(Continued)

(52) U.S. Cl.
CPC ......... *H01L 23/3107* (2013.01); *C08G 59/621* (2013.01); *C08G 59/688* (2013.01); *C08K 3/26* (2013.01); *C08L 63/00* (2013.01); *H01L 23/293* (2013.01); *H01L 23/3164* (2013.01); *H01L 23/495* (2013.01); *H01L 24/48* (2013.01); *H01L 23/49513* (2013.01); *H01L 24/45* (2013.01); *H01L 2224/05624* (2013.01);
(Continued)

(58) Field of Classification Search
USPC .................... 257/788, E23.116, E23.117
See application file for complete search history.

(56) References Cited

U.S. PATENT DOCUMENTS 5,093,712 A * 3/1992 Matsunaga et al. ........... 257/786
5,294,835 A * 3/1994 Igarashi et al. ............... 257/793
(Continued)

FOREIGN PATENT DOCUMENTS

JP       8-4099 A    1/1996
JP   11-297904 A    10/1999
(Continued)

OTHER PUBLICATIONS

International Search Report issued Dec. 28, 2010, in International Application No. PCT/JP2010/006930.

*Primary Examiner* — Yu-Hsi D Sun
(74) *Attorney, Agent, or Firm* — Birch, Stewart, Kolasch & Birch, LLP (57) ABSTRACT

An epoxy resin composition for semiconductor encapsulation of the present invention contains an epoxy resin (A) and a curing agent (B) and is used to encapsulate a copper wire (4) and a semiconductor element (1) connected to this copper wire (4). This epoxy resin composition is such that when a cured product of the epoxy resin composition is heated for 10 hours at 200° C., the amount of generation of a first corrosive gas that is a sulfur compound having corrosiveness to the copper wire (4) is less than or equal to 70 ppm.

14 Claims, 1 Drawing Sheet

(51) Int. Cl.
*C08G 59/62* (2006.01)
*C08G 59/68* (2006.01)
*C08K 3/26* (2006.01)
*C08L 63/00* (2006.01)
*H01L 23/495* (2006.01)
*H01L 23/00* (2006.01)

(52) U.S. Cl.
CPC ............ *H01L 2224/32245* (2013.01); *H01L 2224/45147* (2013.01); *H01L 2224/45565* (2013.01); *H01L 2224/45664* (2013.01); *H01L 2224/48091* (2013.01); *H01L 2224/48247* (2013.01); *H01L 2224/48465* (2013.01); *H01L 2224/73265* (2013.01); *H01L 2224/83101* (2013.01); *H01L 2224/83855* (2013.01); *H01L 2924/01004* (2013.01); *H01L 2924/01005* (2013.01); *H01L 2924/01006* (2013.01); *H01L 2924/01012* (2013.01); *H01L 2924/01013* (2013.01); *H01L 2924/01014* (2013.01); *H01L 2924/01016* (2013.01); *H01L 2924/01018* (2013.01); *H01L 2924/0102* (2013.01); *H01L 2924/01022* (2013.01); *H01L 2924/01027* (2013.01); *H01L 2924/01029* (2013.01); *H01L 2924/0103* (2013.01); *H01L 2924/01038* (2013.01); *H01L 2924/0104* (2013.01); *H01L 2924/01046* (2013.01); *H01L 2924/01056* (2013.01); *H01L 2924/01057* (2013.01); *H01L 2924/01078* (2013.01); *H01L 2924/01079* (2013.01); *H01L 2924/01082* (2013.01); *H01L 2924/01083* (2013.01); *H01L 2924/01105* (2013.01); *H01L 2924/014* (2013.01); *H01L 2924/14* (2013.01); *H01L 2924/12044* (2013.01); *H01L 2924/01019* (2013.01); *H01L 2924/01023* (2013.01); *H01L 2924/01033* (2013.01); *H01L 2924/01075* (2013.01); *H01L 2224/48624* (2013.01); *H01L 2224/48799* (2013.01); *H01L 2924/00015* (2013.01); *H01L 2224/45144* (2013.01)
USPC ........................................................ 257/788

(56) References Cited

U.S. PATENT DOCUMENTS

| | | | |
|---|---|---|---|
| 5,650,459 A | * | 7/1997 | Satake et al. .................. 524/396 |
| 2004/0113267 A1 | * | 6/2004 | Yogo et al. ..................... 257/723 |
| 2007/0029682 A1 | | 2/2007 | Aoki et al. |
| 2011/0089549 A1 | | 4/2011 | Zenbutsu et al. |
| 2011/0294954 A1 | | 12/2011 | Fukutani et al. |

FOREIGN PATENT DOCUMENTS

| | | |
|---|---|---|
| JP | 2002-60589 A | 2/2002 |
| JP | 2004-27001 A | 1/2004 |
| JP | 2005-53978 A | 3/2005 |
| JP | 2005-139260 A | 6/2005 |
| JP | 2006-233145 A | 9/2006 |
| JP | 2007-12776 A | 1/2007 |
| JP | 2007-63549 A | 3/2007 |
| JP | 2007-211252 A | 8/2007 |
| JP | 2007-224124 A | 9/2007 |
| JP | 2007-224167 A | 9/2007 |
| JP | 2009-152561 A | 7/2009 |
| JP | 2010-114408 A | 5/2010 |
| WO | WO 2010/090246 A1 | 8/2010 |

* cited by examiner

EPOXY RESIN COMPOSITION FOR SEMICONDUCTOR ENCAPSULATION, CURED PRODUCT THEREOF, AND SEMICONDUCTOR DEVICE

TECHNICAL FIELD

The present invention relates to an epoxy resin composition for semiconductor encapsulation, a cured product thereof, and a semiconductor device using this cured product.

BACKGROUND ART

In recent years, copper wire has been suggested as an inexpensive bonding wire that substitutes gold wire.

Patent Document 1 describes a bonding wire having a core material containing copper as a main component, and provided thereon, an outer coat layer containing a conductive metal and copper, which is different from the core material in terms of one or both of the component and the composition. In regard to this bonding wire, when the thickness of the outer coat layer is set to 0.001 μm to 0.02 μm, it is described that the material cost is low, and ball bondability, wire bondability and the like are excellent, so that the loop formability is also satisfactory, and then, a copper-based bonding wire which is also adapted to line thinning for narrow pitch applications, and diameter thickening for power IC applications, can be provided.

RELATED DOCUMENT

Patent Document

Patent Document 1: Japanese Patent Application Laid-Open No. 2007-12776

SUMMARY OF THE INVENTION

However, when a semiconductor element connected with the above-described copper wire is encapsulated with an epoxy resin, the high temperature storage life (HTSL) can decrease. According to the finding of the inventors of the present invention, corrosion (oxidative deterioration) in a bonded area between a metal pad and a copper wire on the semiconductor device causes an increase in the electrical resistance at the bonded area, or a short circuit at the bonded area in those semiconductor devices having poor HTSL. Therefore, it has been expected that prevention of such an increase in the electrical resistance at the bonded area or a short circuit at the bonded area makes it possible to improve the HTSL of semiconductor devices.

The present invention was made in view of such circumstances, and an object of the present invention is to provide a resin composition for semiconductor encapsulation, which can reduce the corrosion (oxidative deterioration) of a bonded area between a metal pad and a copper wire on a semiconductor element when the semiconductor element is stored at a high temperature, and enhance the reliability of semiconductor devices, a cured product of the resin composition, and a semiconductor device having this cured product.

According to the present invention, there is provided an epoxy resin composition, including an epoxy resin (A) and a curing agent (B), used for semiconductor encapsulation for encapsulating a copper wire and a semiconductor element connected to the copper wire, wherein when a cured product of the epoxy resin composition for semiconductor encapsulation is heated at 200° C. for 10 hours, the amount of generation of a first corrosive gas that is a sulfur compound having corrosiveness to the copper wire is less than or equal to 70 ppm.

Furthermore, according to the present invention, a cured product of the epoxy resin composition for semiconductor encapsulation described above is provided.

In addition, according to the present invention, there is provided a semiconductor device including a lead frame having a die pad unit; a semiconductor element mounted on the die pad unit; a copper wire that electrically connects the lead frame and the semiconductor element; and an encapsulating resin that is formed from a cured product of an epoxy resin composition and encapsulates the semiconductor element and the copper wire, wherein when the encapsulating resin is heated for 10 hours at 200° C., the amount of generation of a first corrosive gas that is a sulfur compound having corrosiveness to the copper wire is less than or equal to 70 ppm.

According to this invention, the amount of generation of a first corrosive gas that is a sulfur compound, which is generated from the encapsulating resin when the semiconductor device is heated for 10 hours at 200° C., is adjusted to less than or equal to 70 ppm. In this way, corrosion (oxidative deterioration) at a bonded area between a metal pad and a copper wire on the semiconductor element can be reduced. Therefore, an increase in the electrical resistance at the bonded area or a short circuit at the bonded area can be reduced. Accordingly, a semiconductor device having improved high temperature storage characteristics and having high reliability can be realized.

According to the present invention, a semiconductor device having improved high temperature storage characteristics and having high reliability is provided.

DESCRIPTION OF EMBODIMENTS

Hereinafter, embodiments of the present invention will be described with reference to the attached drawings. Meanwhile, in all of the diagrams, the same constituent elements are assigned with the same reference symbol, and explanations thereon will not be repeated appropriately.

The epoxy resin composition for semiconductor encapsulation of the present invention includes an epoxy resin (A) and a curing agent (B), and is used for encapsulating a copper wire and a semiconductor element connected to this copper wire. This epoxy resin composition is such that when a cured product of the epoxy resin composition is heated for 10 hours at 200° C., the amount of generation of a first corrosive gas that is a sulfur compound having corrosiveness to the copper wire is less than or equal to 70 ppm.

Examples of the epoxy resin (A) used in the epoxy resin composition for semiconductor encapsulation of the present invention include all of those monomers, oligomers and polymers, each having two or more epoxy groups in one molecule. Although there are no particular limitations on the molecular weight and molecular structure of the epoxy resin, examples thereof include crystalline epoxy resins such as biphenyl type epoxy resins, bisphenol type epoxy resins, and stilbene type epoxy resins; novolac type epoxy resins such as phenol-novolac type epoxy resins and cresol-novolac type epoxy resins; polyfunctional epoxy resins such as triphenolmethane type epoxy resins and alkyl-modified triphenolmethane type epoxy resins; aralkyl type epoxy resins such as phenol aralkyl type epoxy resins having a phenylene skeleton, and phenol aralkyl type epoxy resins having a biphenylene skeleton; naphthol type epoxy resins such as dihydroxynaphthalene type epoxy resins, and epoxy resins obtainable by glycidyl etherifying dimers of dihydroxynaphthalene; triazine nucleus-containing epoxy resins such as triglycidyl isocyanurate and monoallyl diglycidyl isocyanurate; and bridged cyclic hydrocarbon compound-modified phenol type epoxy resins such as dicyclopentadiene-modified phenol type epoxy resins. These may be used singly, or may be used in combination of two or more kinds.

Preferably, an epoxy resin including at least one selected from the group consisting of epoxy resins represented by the following formula (2), epoxy resins represented by the following formula (3), and epoxy resins represented by the following formula (4) can be used as the epoxy resin (A).

[Chemical Formula 1]

(2)

In the formula (2), $Ar^1$ represents a phenylene group or a naphthylene group; when $Ar^1$ is a naphthylene group, the glycidyl ether group may be bonded to any of the α-position and the β-position; $Ar^2$ represents any one group among a phenylene group, a biphenylene group and a naphthylene group; $R^5$ and $R^6$ each independently represent a hydrocarbon group having 1 to 10 carbon atoms; g represents an integer of 0 to 5; h represents an integer of 0 to 8; and $n^3$ represents the degree of polymerization, and the average value thereof is a positive number of 1 to 3.

[Chemical Formula 2]

(3)

In the formula (3), a plurality of $R^9$s each independently represent a hydrogen atom or a hydrocarbon group having 1 to 4 carbon atoms; and $n^5$ represents the degree of polymerization, and the average value thereof is a positive number of 0 to 4.

[Chemical Formula 3]

(4)

In the formula (4), a plurality of $R^{10}$s and a plurality of $R^{11}$s each independently represent a hydrogen atom or a hydrocarbon group having 1 to 4 carbon atoms; and $n^6$ represents the degree of polymerization, and the average value thereof is a positive number of 0 to 4.

The lower limit of the mixing proportion of the epoxy resin (A) is not particularly limited. The mixing proportion is preferably equal to or more than 3% by mass, and more preferably equal to or more than 5% by mass, relative to the total amount of the epoxy resin composition for semiconductor encapsulation. When the mixing proportion of the epoxy resin (A) is in the range described above, there is a less risk of generating wire scraps due to viscosity increase. Furthermore, the upper limit of the mixing proportion of the epoxy resin (A) is not particularly limited. The mixing proportion is preferably less than or equal to 20% by mass, and more preferably less than or equal to 18% by mass, relative to the total amount of the epoxy resin composition for semiconductor encapsulation. When the upper limit of the mixing proportion of the epoxy resin (A) is in the range described above, there is a less risk of causing a decrease in moisture resistance reliability and the like due to an increase in the water absorption ratio.

The curing agent (B) used in the epoxy resin composition for semiconductor encapsulation of the present invention can be broadly divided into three types such as, for example, a polyaddition type curing agent, a catalyst type curing agent, and a condensation type curing agent.

Examples of the polyaddition type curing agent include polyamine compounds including aliphatic polyamines such as diethylenetriamine (DETA), triethylenetetramine (TETA), and metaxylylenediamine (MXDA), aromatic polyamines such as diaminodiphenylmethane (DDM), m-phenylenediamine (MPDA), and diaminodiphenylsulfone (DDS), as well as dicyandiamides (DICY) and organic acid dihydrazides; acid anhydrides including alicyclic acid anhydrides such as hexahydrophthalic anhydride (HHPA) and methyltetrahydrophthalic anhydride (MTHPA), and aromatic acid anhydrides such as trimellitic anhydride (TMA), pyromellitic anhydride (PMDA), and benzophenonetetracarboxylic acid anhydride (BTDA); polyphenol compounds such as novolac type phenolic resins, and phenol polymers; polymercaptan compounds such as polysulfides, thio esters, and thioethers; isocyanate compounds such as isocyanate prepolymers and blocked isocyanates; and organic acids such as carboxylic acid-containing polyester resins.

Examples of the catalyst type curing agent include tertiary amine compounds such as benzyldimethylamine (BDMA), and 2,4,6-trisdimethylaminomethylphenol (DMP-30); imidazole compounds such as 2-methylimidazole, and 2-ethyl-4-methylimidazole (EMI24); and Lewis acids such as BF3 complexes.

Examples of the condensation type curing agent include phenolic resin-based curing agents such as novolac type phenolic resins and resol type phenolic resins; urea resins such as methylol group-containing urea resins; and melamine resins such as methylol group-containing melamine resins.

Among these, moisture resistance, electrical characteristics, curability, storage stability and the like, phenolic resin-based curing agents are preferred from the viewpoint of achieving a balance between flame resistance. The phenolic resin-based curing agents include all of monomers, oligomers and polymers, each having two or more phenolic hydroxyl groups in one molecule. There are no particular limitations on the molecular weight and the molecular structure. Examples of the phenolic resin-based curing agents include novolac type resins such as phenol-novolac resins and cresol-novolac resins; polyfunctional type phenolic resins such as triphenolmethane type phenolic resins; modified phenolic resins such as terpene-modified phenolic resins and dicyclopentadiene-modified phenolic resins; aralkyl type resins such as phenol aralkyl resins having a phenylene skeleton and/or a biphenylene skeleton, and naphthol aralkyl resins having a phenylene and/or a biphenylene skeleton; and bisphenol compound such as bisphenol A and bisphenol F. These may be used singly, or may be used in combination of two or more kinds.

Preferably, at least one curing agent selected from the group consisting of compounds represented by the following formula (5) can be used as the curing agent (B).

[Chemical Formula 4]

(5)

In the formula (5), $Ar^3$ represents a phenylene group or a naphthylene group; when $Ar^3$ is a naphthylene group, the hydroxyl group may be bonded to any of the α-position and the β-position, $Ar^4$ represents any one group among a phenylene group, a biphenylene group and a naphthylene group; $R^7$ and $R^8$ each independently represent a hydrocarbon group having 1 to 10 carbon atoms; i represents an integer of 0 to 5; j represents an integer of 0 to 8; and $n^4$ represents the degree of polymerization, and the average value thereof is a positive number of 1 to 3.

The lower limit of the mixing proportion of the curing agent (B) is not particularly limited. The mixing proportion is preferably equal to or more than 0.8% by mass, and more preferably equal to or more than 1.5% by mass, in the epoxy resin composition for semiconductor encapsulation. When the lower limit of the mixing proportion is in the range described above, sufficient fluidity can be obtained. Furthermore, the upper limit of the mixing proportion of the curing agent (B) is also not particularly limited. The mixing proportion is preferably less than or equal to 16% by mass, and more preferably less than or equal to 14% by mass, in the epoxy resin composition for semiconductor encapsulation. When the upper limit of the mixing proportion is in the range described above, there is a less risk of causing a decrease in moisture resistance reliability and the like due to an increase in the water absorption ratio.

Furthermore, the mixing ratio of the epoxy resin and the phenolic resin-based curing agent in the case of using a phenolic resin-based curing agent as the curing agent (B) is preferably equal to or more than 0.8 and equal to or less than 1.3 in the equivalent ratio of the total number of epoxy groups of the epoxy resin (EP) and the total number of phenolic hydroxyl groups of the phenolic resin-based curing agent (OH), (EP)/(OH). When the equivalent ratio is in this range, there is a less risk of causing a decrease in the curability of the epoxy resin composition for semiconductor encapsulation, a decrease in the properties of the resin cured product or the like.

Furthermore, the epoxy resin composition for semiconductor encapsulation of the present invention may include an inorganic filler material, and if necessary, a neutralizing agent or a curing accelerator.

As the inorganic filler material, those used in general epoxy resin compositions for semiconductor encapsulation can be used. Examples thereof include fused spherical silica, fused crushed silica, crystalline silica, talc, alumina, titanium white, and silicon nitride. Fused spherical silica is particularly preferred among them. These inorganic filler materials may be used singly, or may be used in combination of two or more kinds. Furthermore, the spherical shape of the inorganic filler material has preferably as true as possible, and the particle size distribution of the inorganic filler material is as broad as possible in order to suppress an increase in the melt viscosity of the epoxy resin composition for semiconductor encapsulation and to further increase the content of the inorganic filler material. Also, the inorganic filler material may be surface-treated with a coupling agent. In addition, if necessary, the inorganic filler material may be preliminarily treated with an epoxy resin or a phenolic resin before use. Examples of the method for such treatment include a method of mixing the resin with the inorganic filler material using a solvent, and then removing the solvent; and a method of adding the resin directly to the inorganic filler material, and treating the mixture by mixing using a mixing machine.

There are no limitations on the content proportion of the inorganic filler material. In consideration of the fillability of the epoxy resin composition for semiconductor encapsulation and the reliability of semiconductor devices, the content proportion is preferably equal to or more than 60% by mass, and more preferably equal to or more than 65% by mass, relative to the total amount of the epoxy resin composition for semiconductor encapsulation. If the content proportion is in a range which does not fall below the lower limit described above, low hygroscopic properties and low thermal expandability are obtained. Therefore, there is a less risk of having insufficient moisture resistance reliability. Furthermore, when moldability is considered, the upper limit of the content proportion of the inorganic filler material is preferably less than or equal to 92% by mass, and more preferably less than or equal to 89% by mass, relative to the total amount of the epoxy resin composition for semiconductor encapsulation. If the content proportion is in a range which does not exceed the upper limit described above, there is a less risk of having decreased fluidity and having filling failure at the time of molding, or of having inadequate wire flow or the like in semiconductor devices due to viscosity increase.

The epoxy resin composition used in the present invention may also include a neutralizing agent which neutralizes the acidic corrosive gas generated by heating of a cured product of the epoxy resin composition, in order to suppress the corrosion (oxidative deterioration) at the bonded area between a copper wire and an aluminum electrode pad of the semiconductor element. Specifically, it is preferable to incorporate at least one neutralizing agent selected from the group consisting of basic metal salts, particularly compounds containing calcium element, compounds containing aluminum element, and compounds containing magnesium element.

Examples of the compounds containing calcium element include calcium carbonate, calcium borate, and calcium metasilicate, preferably calcium carbonate, and more preferably precipitated calcium carbonate synthesized by a carbon dioxide reaction method from the viewpoints of the content of impurities, water resistance, and low water absorption ratio.

Examples of the compounds containing aluminum element include aluminum hydroxide and boehmite, preferably aluminum hydroxide, and more preferably low sodium aluminum hydroxide synthesized by the two-stage Bayer process.

Examples of the compounds containing magnesium element include hydrotalcite, magnesium oxide, and magnesium carbonate. A hydrotalcite represented by the following formula (1) is preferred from the viewpoints of the content of impurities and low water absorption ratio.

$$M_a Al_b(OH)_{2a+3b-2c}(CO_3)_c \cdot mH_2O \tag{1}$$

In the formula (1), M represents a metal element containing at least Mg; a, b and c respectively represent numbers satisfying the relations: $2 \le a \le 8$, $1 \le b \le 3$, and $0.5 \le c \le 2$; and m represents an integer of equal to or larger than 0.

Specific examples of hydrotalcite include $Mg_6Al_2(OH)_{16}(CO_3) \cdot mH_2O$, $Mg_3ZnAl_2(OH)_{12}(CO_3) \cdot mH_2O$, and $Mg_{4.3}Al_2(OH)_{12.6}(CO_3) \cdot mH_2O$.

In the epoxy resin composition used in the present invention, the content of the neutralizing agent is preferably equal to or more than 0.01% by mass and equal to or less than 10% by mass relative to the total amount of the composition. If the content of the neutralizing agent is less than the lower limit described above, a sufficient effect of adding a neutralizing agent may not be obtained. Particularly, there is a tendency that the corrosion (oxidative deterioration) at the bonded areas between a copper wire and an aluminum electrode pad of the semiconductor element cannot be prevented, and the HTSL of the semiconductor device decreases. On the other hand, if the content is more than the upper limit described above, there is a tendency that the moisture absorption ratio increases, and solder crack resistance decreases. Particularly, when calcium carbonate or hydrotalcite is used as a corrosion preventing agent, the content of the agent is preferably equal to or more than 0.05% by mass and equal to or less than 2% by mass, relative to the total amount of the composition from the similar viewpoint as above.

The epoxy resin composition for semiconductor encapsulation of the present invention can further use a curing accelerator. The curing accelerator may be a compound capable of accelerating a crosslinking reaction between the epoxy group of the epoxy resin and a curing agent (for example, the phenolic hydroxyl group of a phenolic resin-based curing agent), and those used in general epoxy resin compositions for semiconductor encapsulation can be used. Examples thereof include diazabicycloalkenes such as 1,8-diazabicyclo(5,4,0)undecene-7, and derivatives thereof; organic phosphines such as triphenylphosphine, and methyldiphenylphosphine; imidazole compounds such as 2-methylimidazole; tetra-substituted phosphonium tetra-substituted borates such as tetraphenylphosphinium tetraphenylborate; and adducts between phosphine compounds and quinone compounds. These may be used singly, or may be used in combination of two or more kinds.

The lower limit of the mixing proportion of the curing accelerator is not particularly limited. The mixing proportion is preferably equal to or more than 0.05% by mass, and more preferably equal to or more than 0.1% by mass, relative to the total amount of the epoxy resin composition for semiconductor encapsulation. When the lower limit of the mixing proportion of the curing accelerator is in the range described above, there is a less risk of causing a decrease in curability. Furthermore, the upper limit of the mixing proportion of the curing accelerator is no particularly limited. The mixing proportion is preferably less than or equal to 1% by mass, and more preferably less than or equal to 0.5% by mass, relative to the total amount of the epoxy resin composition for semiconductor encapsulation. When the upper limit of the mixing proportion of the curing accelerator is in the range described above, there is a less risk of causing a decrease in fluidity.

In the epoxy resin composition for semiconductor encapsulation of the present invention, if necessary, various additives such as aluminum corrosion preventing agents such as zirconium hydroxide; inorganic ion exchangers such as bismuth oxide hydrate; coupling agents such as γ-glycidoxypropyltrimethoxysilane, 3-mercaptopropyltrimethoxysilane, and 3-aminopropyltrimethoxysilane; colorants such as carbon black or red iron oxide; low stress components such as silicone rubbers; releasing agents such as natural waxes such as carnauba wax, synthetic waxes, higher fatty acids and metal salts thereof, such as zinc stearate, and paraffins; flame retardants such as aluminum hydroxide, magnesium hydroxide, zinc borate, zinc molybdate, and phosphazene; and oxidation inhibitors, may be appropriately incorporated.

As the epoxy resin composition for semiconductor encapsulation used in the semiconductor device of the present invention, a composition prepared by mixing the various components described above using, for example, a mixer at 15° C. to 28° C.; a composition prepared by further melt kneading the components thereafter using a kneading machine such as a roller, a kneader or an extruder, cooling the kneading product and then pulverizing the kneading product; and a composition prepared by appropriately adjusting the dispersibility, fluidity or the like as necessary; can be used.

A cured product of the epoxy resin composition for semiconductor encapsulation of the present invention can be obtained by molding and curing the epoxy resin composition described above by a conventional molding method such as transfer molding, compression molding or injection molding. The cured product of the epoxy resin composition that has been molded and cured by a molding method such as transfer molding can also be obtained by, if necessary, completely curing the epoxy resin composition at a temperature of about 80° C. to 200° C. for a time period of about 10 minutes to 10 hours.

When the cured product of the epoxy resin composition for semiconductor encapsulation of the present invention thus obtained is heated for 10 hours at 200° C. in a dry air atmosphere, the amount of generation of a first corrosive gas generated from the cured product is less than or equal to 70 ppm. The term "dry air" as used herein means an air from which moisture and carbon dioxide have been eliminated, and specifically, the term means an air in which the moisture content has been adjusted to less than or equal to 0.1% by volume, and the carbon dioxide concentration to less than or equal to 0.04% by volume. The first corrosive gas is not particularly limited as long as the gas includes any compound which contains sulfur element and has corrosiveness to copper wires. Examples thereof include sulfur dioxide gas (sulfur dioxide, $SO_2$), hydrogen sulfide ($H_2S$), and sulfur trioxide ($SO_3$), and these may be generated singly or in combination of two or more kinds.

The amount of generation of the first corrosive gas that is generated from the cured product of the epoxy resin composition for semiconductor encapsulation of the present invention is less than or equal to 70 ppm. The amount of generation is preferably less than or equal to 60 ppm from the viewpoint that HTSL at 150° C. can be secured, and more preferably less than or equal to 35 ppm from the viewpoint that the high temperature storage characteristics at 175° C., which is a higher temperature, can be enhanced.

Furthermore, the cured product of the epoxy resin composition for semiconductor encapsulation of the present invention may generate a second corrosive gas and a third corrosive gas, both having corrosiveness to copper wires, when the cured product is heated for 10 hours at 200° C. in a dry air atmosphere. At this time, the total amount of generation of the first, second and third corrosive gases is preferably less than or equal to 230 ppm from the viewpoint that the HTSL at 150° C. can be secured, and more preferably less than or equal to 200 ppm from the viewpoint that the high temperature storage characteristics at 175° C., which is a higher temperature, can be enhanced.

The second corrosive gas is a halogen compound having corrosiveness to copper wires, and specific examples thereof include hydrogen fluoride, hydrogen chloride, hydrogen bromide, and hydrogen iodide. These halogen compounds may be generated singly, or two or more kinds of different halogen compounds may also be generated.

The third corrosive gas includes an organic acid having corrosiveness to copper wires, and specific examples thereof include aliphatic carboxylic acids having 1 to 4 carbon atoms. More specific examples include formic acid, acetic acid, propionic acid, and butyric acid, and these compounds may be generated singly, or two or more of different organic acids may be generated.

The amount of generation of the first, second and third corrosive gases can be analyzed by collecting the corrosive gases generated when the cured product is heated for 10 hours at 200° C., directly or in a liquid, and performing ion chromatography.

The analysis conditions are as follows.

Analysis apparatus: "Model ICS2000" manufactured by Dionex Corp.

Column: "AS17" manufactured by Dionex Corp.

Flow rate: 1.5 ml/min

Detector: Electrical conductivity detector

Solvent: Potassium hydroxide (gradient 1 mL to 35 mL)

Retention time: Sulfite ion 12.7 minutes, chloride ion 6.0 minutes, formic acid 3.6 minutes, and acetic acid 2.9 minutes Next, the semiconductor device of the present invention will be described with reference to FIG. 1. The semiconductor device of the present invention includes a lead frame 3 having a die pad unit 3a; a semiconductor element 1 mounted on the die pad unit 3a; a copper wire 4 which electrically connects the lead frame 3 and the semiconductor element 1; and an encapsulating resin 5 which is formed from a cured product of the epoxy resin composition described above and encapsulates the semiconductor element 1 and the copper wire 4.

Figure 1:
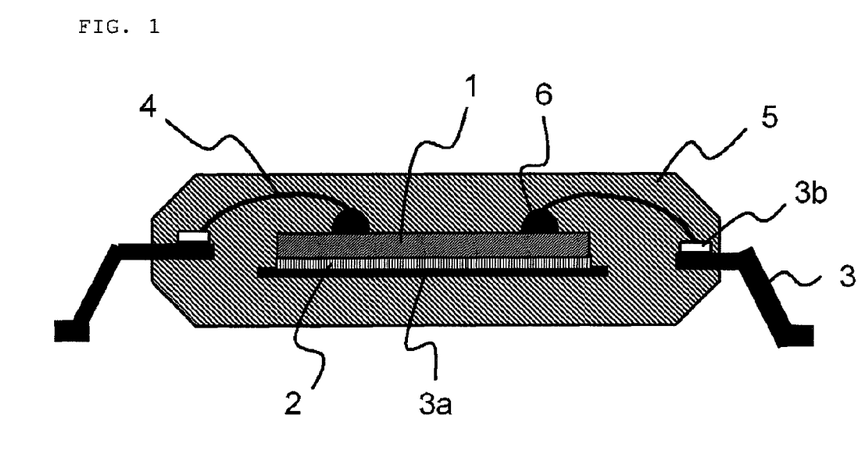
FIG. 1 is a cross-sectional diagram schematically showing a semiconductor device according to an embodiment.

There are no particular limitations on the semiconductor element 1, and examples thereof include an integrated circuit, a large-sized integrated circuit, and a solid image pick-up element.

There are no particular limitations on the lead frame 3 used in the present invention, and a circuit board may be used instead of the lead frame 3. Specifically, lead frames or circuit boards used in conventionally known semiconductor devices such as dual in-line package (DIP), plastic lead chip carrier (PLCC), quad flat package (QFP), low-profile quad flat package (LQFP), small outline J-lead package (SOJ), thin small outline package (TSOP), thin quad flat package (TQFP), tape carrier package (TCP), ball grid array (BGA), chip size package (CSP), quad flat non-leaded package (QFN), small outline non-leaded package (SON), lead frame BGA (LF-BGA), and mold array package type BGA (MAP-BGA) can be used.

The semiconductor element 1 may be a laminate of plural semiconductor elements. In this case, the semiconductor element of the first layer is adhered to the die pad unit 3a through the cured product of a die bonding material 2 such as a film adhesive or a thermosetting adhesive. The semiconductor elements of the second layer and the subsequent layers can be sequentially laminated by means of an insulating film adhesive. Then, an electrode pad 6 is formed as the uppermost layer.

The electrode pad 6 contains aluminum as a main component. There are no particular limitations on the purity of the aluminum used in the electrode pad 6. The purity is preferably equal to or more than 99.5% by mass. The electrode pad 6 can be produced by forming a general barrier layer made of titanium on the surface of a copper circuit terminal in the lower layer, and applying a general method for forming an electrode pad in a semiconductor element, such as deposition, sputtering or electroless plating of aluminum.

The copper wire 4 is used to electrically connect the lead frame 3 and the semiconductor element 1 mounted on the die pad unit 3a of the lead frame 3. On the surface of the copper wire 4, an oxide film is formed naturally or inevitably in terms of the process. According to the present invention, the copper wire 4 also encompasses a copper wire including an oxide film formed on the wire surface as such.

The wire diameter of the copper wire 4 is preferably less than or equal to 30 µm, more preferably less than or equal to 25 µm, and equal to or more than 15 µm. When the wire diameter is in this range, the ball shape at the copper wire tip is stabilized, and the connection reliability at the bonded part can be enhanced. Furthermore, the wire flow can be reduced by the hardness of the copper wire itself.

There are no particular limitations on the copper wire 4. A copper purity of a copper wire is preferably equal to or more than 99.99% by mass, and more preferably equal to or more than 99.999% by mass. In general, stabilization of the ball side shape at the copper wire tip at the time of bonding can be promoted by adding various elements (dopants) to copper. However, if dopants are added in a large amount such as more than 0.01% by mass, the ball part is hardened at the time of wire bonding, and then, the electrode pad 6 side of the semiconductor element 1 is damaged, causing inconveniences such as a decrease in moisture resistance reliability due to the lack of bonding, a decrease in the high temperature storage characteristics, and an increase in the electrical resistance value. On the contrary, if a copper wire 4 having a copper purity of equal to or more than 99.99% by mass is used, since the ball part has sufficient flexibility, there is no risk of causing damage to the pad side at the time of bonding. Meanwhile, the copper wire 4 that can be used in the semiconductor device of the present invention acquires further improved adhesive strength to the ball shape by doping Ba, Ca, Sr, Be, Al or a rare earth metal to copper as the core wire in an amount of 0.001% by mass to 0.003% by mass.

Furthermore, it is preferable that a surface of the copper wire 4 has a coating layer composed of a metal material including palladium. In this way, the ball shape at the copper wire tip is stabilized, and the connection reliability of the bonded area can be enhanced. Furthermore, an effect of preventing oxidative deterioration of copper which constitutes the core wire can also be obtained, and the high temperature storage characteristics at the bonded parts can be enhanced.

The thickness of the coating layer constituted of a metal material including palladium in the copper wire 4 is preferably 0.001 µm to 0.02 µm, and more preferably 0.005 µm to 0.015 µm. If the thickness is larger than the upper limit, there is a risk that the copper as the core material and the metal material including palladium as the coating material may not sufficiently fuse at the time of wire bonding, the ball shape may become unstable, and the moisture resistance and high temperature storage characteristics of the bonded part may deteriorate. Furthermore, if the thickness is smaller than the lower limit, there is a risk that the oxidative deterioration of copper in the core wire may not be sufficiently prevented, and similarly, the moisture resistance and high temperature storage characteristics of the bonded part may be deteriorated.

The copper wire 4 can be obtained by casting a copper alloy into a melting furnace, rolling the ingot, further performing wire drawing using a die, and subjecting the resultant to a post-heat treatment of heating the wire while continuously sweeping the wire. The coating layer composed of a metal material including palladium in the copper wire 4 that can be used in the semiconductor device of the present invention can be formed by preliminarily preparing a wire having the target wire diameter, immersing the wire in an electrolytic solution or electroless solution containing palladium, and plating the wire by continuously sweeping. In this case, the thickness of the coating can be adjusted by the sweeping speed. Also, a technique of preparing a wire having a larger thickness than the target thickness, immersing this in an electrolytic solution or electroless solution, forming a coating layer by continuously sweeping, and performing wire drawing until a predetermined diameter is obtained, is also employed.

The lead unit 3b of the lead frame 3 and the semiconductor element 1 may be bonded through reverse bonding of wire. Under reverse bonding, a ball formed at the tip of the copper wire 4 is bonded to the electrode pad 6 of the semiconductor element 1, and the copper wire 4 is cut to form a bump for stitch bonding. Subsequently, the ball formed at the tip of the wire is bonded to the metal-plated lead unit 3b of the lead frame 3, and the ball is stitch bonded to the bump of the semiconductor element. When reverse bonding is employed, the wire height on the semiconductor element 1 can be made lower than the height obtainable through forward bonding, and therefore, the bonding height of the semiconductor element 1 can be made low.

The semiconductor device of the present invention is obtained by encapsulating electronic components such as a semiconductor element using an epoxy resin composition for semiconductor encapsulation, and curing and molding the semiconductor device by a conventional molding method such as transfer molding, compression molding or injection molding. The semiconductor device encapsulated by a molding method such as transfer molding is mounted on an electronic instrument or the like directly or after being completely cured at a temperature of about 80° C. to 200° C., for a time period of about 10 minutes to 10 hours.

The encapsulating resin 5 is a cured product of the epoxy resin composition described above. Accordingly, when the encapsulating resin 5 is heated for 10 hours at 200° C. in a dry air atmosphere, the amount of generation of a first corrosive gas that is a sulfur compound having corrosiveness to the copper wire 4 is less than or equal to 70 ppm. Furthermore, when the encapsulating resin 5 is heated for 10 hours at 200° C. in a dry air atmosphere, a second corrosive gas that is a halogen compound, and a third corrosive gas that is an organic acid may be generated; however, it is preferable that the total amount of generation of the first, second and third corrosive gases be less than or equal to 230 ppm.

The amount of generation of the first, second and third corrosive gases occurring as a result of a heat treatment of the encapsulating resin 5 can be analyzed by ion chromatography, similarly to the case of the cured product of the epoxy resin composition as described above.

Next, the operating effect of the present invention will be specifically explained with reference to FIG. 1. According to the present invention, the amount of generation of sulfur dioxide that is generated from the encapsulating resin 5 when the semiconductor device is heated for 10 hours at 200° C., is adjusted to less than or equal to 70 ppm. In this way, the corrosion (oxidative deterioration) of the bonded area between the copper wire 4 and the aluminum electrode pad of the semiconductor element can be reduced. Therefore, it is possible to realize a highly reliable semiconductor device in which an increase in the electrical resistance at the bonded area or a short circuit at the bonded area does not easily occur.

Since the copper wire 4 is inexpensive, it is useful for the cost reduction for semiconductor devices. However, when a semiconductor element 1 connected to a copper wire 4 is encapsulated with a conventional epoxy resin composition, the HTSL can decrease.

The mechanism of the corrosion (oxidative deterioration) of the bonded area between the copper wire 4 and the aluminum electrode pad 6 of the semiconductor element 1 can be contemplated to be as follows. At the bonding interface between a copper wire 4 and the aluminum electrode pad 6 of a semiconductor element 1, a copper-aluminum alloy is formed. Copper-aluminum alloys generally have low corrosion resistance. At the time of high temperature storage, a trace amount of a corrosive gas (acidic gas) is generated from the cured product of the epoxy resin composition constituting the encapsulating resin 5, through thermal decomposition. This corrosive gas causes dry corrosion (corrosion, oxidative deterioration) of the copper-aluminum alloy layer having low corrosion resistance, and then, an increase in the electrical resistance or a short circuit at the bonded area occurs.

Thus, the amount of generation of the first corrosive gas that is a sulfur compound, which is generated from the encapsulating resin 5 when the semiconductor device is heat treated, is adjusted to less than or equal to 70 ppm. In this manner, the corrosion (oxidative deterioration) of the bonded area between the copper wire 4 and the aluminum electrode pad 6 of the semiconductor element 1 can be prevented. The total amount of generation of the first corrosive gas that is a sulfur compound, the second corrosive gas that is a halogen compound, and a third corrosive gas that is an organic acid, that are all generated from the encapsulating resin 5, is adjusted to less than or equal to 230 ppm. In this manner, the corrosion (oxidative deterioration) of the bonded area between the copper wire 4 and the aluminum electrode pad 6 of the semiconductor element 1 can be effectively prevented. Accordingly, the semiconductor device of the present invention has excellent high temperature storage characteristics. That is, when the semiconductor device of the present invention is stored in an environment at 150° C., and a semiconductor device having an increment of 20% relative to the initial value of the electrical resistance value among the wirings is determined as a failure, a failure does not occur even if the semiconductor device is stored at a high temperature for 2000 hours. Furthermore, when the semiconductor device of the present invention is stored in an environment at 175° C., and failure is determined in the same manner, a failure does not occur even if the semiconductor device is stored at a high temperature for 200 hours.

Usually, if a semiconductor device has resistance for equal to or longer than 2000 hours at 150° C., or for equal to or longer than 200 hours at 175° C., sufficient reliability can be secured. Therefore, the high temperature storage characteristics of the semiconductor device can be sufficiently secured by adjusting the amount of generation of the corrosive gas that can be generated when the cured product of the epoxy resin composition is heat treated for 10 hours at 200° C. to the range described above.

As such, according to the epoxy resin composition of the present invention, a semiconductor device having superior high temperature storage characteristics can be obtained, and therefore, a highly reliable semiconductor device in which a short circuit does not easily occur can be realized.

Thus, embodiments of the present invention have been described with reference to the attached drawings, but these are only exemplary embodiments of the present invention, and various configurations other than those described above can also be employed.

EXAMPLES

Hereinafter, the present invention will be more specifically described by way of Examples and Comparative Examples, but the present invention is not intended to be limited to the following Examples. The various components of the epoxy resin compositions used in the Examples and the Comparative Examples are shown below.

<Epoxy Resin>

BA-1: A phenol aralkyl type epoxy resin having a biphenylene skeleton (an epoxy resin represented by the formula (2) in which $Ar^1$ is a phenylene group; $Ar^2$ is a biphenylene group; g is 0; and h is 0; "NC3000" manufactured by Nippon Kayaku Co., Ltd.; softening point 58° C., epoxy equivalent: 276, hydrolytic chlorine: 230 ppm).

BA-2: A phenol aralkyl type epoxy resin having a biphenylene skeleton (a general-purpose product of BA-1, softening point: 55° C., epoxy equivalent: 283, hydrolytic chlorine: 3000 ppm).

BP-1: A biphenyl type epoxy resin (an epoxy resin represented by the formula (3) in which $R^9$s at the 3-position, 3'-position, 5-position and 5'-position are methyl groups; and $R^9$s at the 2-position, 2'-position, 6-position and 6'-position are hydrogen atoms, "YX4000H" manufactured by Japan Epoxy Resin Co., Ltd.; melting point: 105° C., epoxy equivalent: 191, hydrolytic chlorine: 150 ppm).

BP-2: A biphenyl type epoxy resin (an epoxy resin represented by the formula (3) in which $R^9$s at the 3-position, 3'-position, 5-position and 5'-position are methyl groups; and $R^9$s at the 2-position, 2'-position, 6-position and 6'-position are hydrogen atoms; "YX4000" manufactured by Japan Epoxy Resin Co., Ltd.; melting point: 105° C., epoxy equivalent: 185, hydrolytic chlorine: 670 ppm).

BP-3: A biphenyl type epoxy resin (an epoxy resin obtained by purifying, by a recrystallization method, an epoxy resin represented by the formula (3) in which $R^9$s at the 3-position, 3'-position, 5-position and 5'-position are methyl groups; and $R^9$s at the 2-position, 2'-position, 6-position and 6'-position are hydrogen atoms; "YX4000UH" manufactured by Mitsubishi Chemical Corp.; melting point: 113° C., epoxy equivalent: 177, hydrolytic chlorine: less than 15 ppm).

<Curing Agent>

HA-1: A phenol aralkyl resin having a biphenylene skeleton (a phenol aralkyl resin represented by the formula (5) in which i is 0; j is 0; $Ar^3$ is a phenylene group; and $Ar^4$ is a biphenylene group; "MEH-7851SS" manufactured by Meiwa Plastic Industries, Ltd.; softening point: 65° C., hydroxyl group equivalent: 203).

HB-1: A phenol aralkyl resin (a phenol aralkyl resin represented by the formula (5) in which i is 0; j is 0; $Ar^3$ is a phenylene group; and $Ar^4$ is a phenylene group; "XLC-2L" manufactured by Mitsui Chemical, Inc.; hydroxyl group equivalent: 175, melt viscosity at 150° C.: 360 mPa·s).

<Filler Material>

Fused spherical silica (average particle size: 26.5 μm, proportion of particles having a size of equal to or more than 105 μm: less than or equal to 1%; "FB-820" manufactured by Denki Kagaku Kogyo K.K.)

<Neutralizing Agent>

Hydrotalcite (hydrotalcite represented by the formula (1) in which a is 4.3; b is 2; and c is 1; "DHT-4A (registered trademark)" manufactured by Kyowa Chemical Industry Co., Ltd.)

<Curing Accelerator>

A: 1,4-Benzoquinone adduct of triphenylphosphine (TPP, "PP360" manufactured by K.I. Chemical Industry Co., Ltd.)

B: Triphenylphosphine (TPP, "PP360" manufactured by K.I. Chemical Industry Co., Ltd.)

<Coupling Agent>

C-1: γ-glycidoxypropyltrimethoxysilane

C-2: γ-mercaptopropyltriethoxysilane

<Flame Retardant>

Aluminum hydroxide (manufactured by Sumitomo Chemical Co., Ltd., CL-310, average particle size: 9.6 μm, specific surface area: 1.1 m²/g)

In addition to the various components described above, carbon black was used as a colorant, and carnauba wax was used as a releasing agent.

Preparation of Epoxy Resin Composition:

Example 1

The epoxy resin BA-1 (5.91 parts by mass), the curing agent HA-1 (4.34 parts by mass), fused spherical silica as the filler material (86.40 parts by mass), hydrotalcite as the neutralizing agent (0.30 parts by mass), the curing accelerator A (0.50 parts by mass), the coupling agent C-1 (0.25 parts by mass), carbon black as the colorant (0.30 parts by mass), carnauba wax as the releasing agent (0.50 parts by mass), and aluminum hydroxide as the flame retardant (1.50 parts by mass) were mixed using a mixer at 15° C. to 28° C., and then the mixture was roll-kneaded at 70° C. to 100° C. After the kneaded product was cooled, the kneaded product was pulverized, and thus an epoxy resin composition was obtained.

Examples 2 to 5 and Comparative Examples 1 to 3

Epoxy resin compositions for semiconductor encapsulation were obtained in the same manner as in Example 1 according to the epoxy resin composition blends for semiconductor encapsulation indicated in Table 1. In Table 1, the unit for the various components is expressed in parts by mass.

Examples 6 to 12 and Comparative Examples 4 to 6

Epoxy resin compositions for semiconductor encapsulation were obtained in the same manner as in Example 1 according to the epoxy resin composition blends for semiconductor encapsulation indicated in Table 2. In Table 2, the unit for the various components is expressed in parts by mass.

Production of Semiconductor Device

A TEG (test element group) chip (3.5 mm×3.5 mm) equipped with an aluminum electrode pad was adhered to the die pad unit of a 352-pin BGA (the substrate was a bismaleimide-triazine resin/glass cross substrate having a thickness of 0.56 mm, the package size is 30 mm×30 mm, thickness 1.17 mm), and the aluminum electrode pad of the TEG chip and the electrode pad of the substrate were wire bonded through a daisy chain connection using a copper wire 4N at a wire pitch of 80 μm. This was subjected to encapsulation molding with any of the epoxy resin compositions of Examples 1 to 12 and Comparative Examples 1 to 6, using a low pressure transfer molding machine ("Y series" manufactured by Towa Corp.) under the conditions of a mold temperature of 175° C., an injection pressure of 6.9 MPa, and a curing time of 2 minutes. Thus, a 352-pin BGA package was produced. This package was post-cured under the conditions of 175° C. and 4 hours, and thus a semiconductor device was obtained.

Evaluation Method:

(1) Evaluation of Properties of Epoxy Resin Composition

The properties of the epoxy resin composition thus obtained were measured by the following methods. The results are shown in Tables 1 and 2.

<Spiral Flow (SF)>

Each of the epoxy resin compositions of Examples 1 to 12 and Comparative Examples 1 to 6 was injected into a mold for spiral flow measurement according to EMMI-1-66, using a low pressure transfer molding machine ("KTS-15" manufactured by Kohtaki Precision Machine Co., Ltd.) under the conditions of a mold temperature of 175° C., an injection pressure of 6.9 MPa, and a curing time of 120 seconds, and the flow length (unit: cm) was measured. If the flow length is less than or equal to 80 cm, molding failure such as unfilled package may occur.

<Gel Time (GT)>

Each of the epoxy resin compositions of Examples 1 to 12 and Comparative Examples 1 to 6 was melted on a heat plate heated to 175° C., and then the time taken for the epoxy resin composition to cure while being kneaded with a spatula was measured.

<Measurement of Amount of Corrosive Gas>

Figure 2:
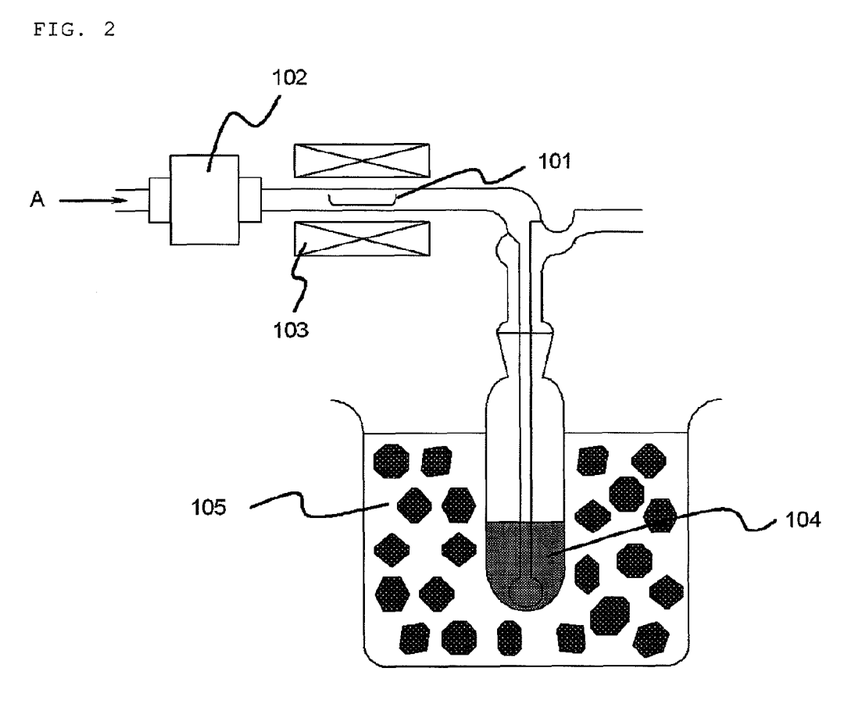
FIG. 2 is a diagram showing an example of the apparatus used in the evaluation of the epoxy resin composition for semiconductor encapsulation of the present invention.

Each of the epoxy resin compositions of Examples 1 to 12 and Comparative Examples 1 to 6 was cured for 4 hours at 175° C., and then this cured product was pulverized with a vibrating mill. The obtained powder of the cured product was sieved through a sieve having a nominal mesh size of 74 μm (200-mesh) to exclude coarse particles, and 2 g of the obtained sample was placed on the sample board 101 of a tube-shaped furnace made of glass as shown in FIG. 2. Subsequently, dry air in which the carbon dioxide concentration had been adjusted to less than or equal to 0.04% by volume by passing air A having a moisture content of less than or equal to 0.1% by volume through a $CO_2$ trap (air vent filter) 102 was introduced to the sample board 101. The powder of the cured product was heated for 10 hours at 200° C. using the heating furnace 103 under the atmosphere of this dry air (flow rate: 10 ml/min). The corrosive gas generated therefrom was collected in a scavenging liquid 104 that had been cooled in ice water 105, and the entire amount was used as 25 mL of test liquid. Specifically, a dilute hydrogen peroxide solution (a product obtained by adding 0.1 ml of aqueous hydrogen peroxide at a concentration of 35% in 25 ml of ultrapure water) was used as the scavenging liquid 104 for the given sulfurous acid gas. Furthermore, a dilute potassium hydroxide solution (8 mmol/L) was used as a scavenging liquid 105 for hydrogen chloride and organic acids (formic acid and acetic acid). The obtained test liquids were introduced into an ion chromatography apparatus ("Model ICS2000" manufactured by Dionex Corp.). The analysis conditions were as described above [flow rate: 1.5 ml/min, detector: electrical conductivity detector, solvent: potassium hydroxide (gradient 1 mM to 35 mM)]. Each ion was quantitatively measured by a calibration curve method, and then, the amounts of ions generated from the sample were calculated. The results are shown in Tables 1 and 2.

(2) Evaluation of Characteristics of Semiconductor Device

The high temperature storage life (HTSL) of the semiconductor devices thus produced was measured by the following method. The results are shown in Tables 1 and 2.

<HTSL 1>

The semiconductor devices thus obtained were stored in an environment at 150° C., and the electrical resistance value among the wirings was measured every 24 hours. A semiconductor device in which the electrical resistance value increased by 20% as compared with the initial value was determined as a failure, and the time (unit: hours) taken until the occurrence of failure was measured. The measurement was carried out with five semiconductor devices, and among these, the shortest time taken until the occurrence of failure is shown in Tables 1 and 2. Meanwhile, if failure did not occur when all the semiconductor devices were stored at a high temperature for 2000 hours, the case is indicated as ">2000".

<HTSL2>

The semiconductor devices thus obtained were stored in an environment at 175° C., and the electrical resistance value among the wirings was measured every 24 hours. A semiconductor device in which the electrical resistance value increased by 20% as compared with the initial value was determined as a failure, and the time (unit: hours) taken until the occurrence of failure was measured. The measurement was carried out with five semiconductor devices, and among these, the shortest time taken until the occurrence of failure is shown in Tables 1 and 2.

<Determination>

A case in which failure did not occur even if the semiconductor devices were stored at a high temperature for 2000 hours in connection with the HTSL1, and failure did not occur even if the semiconductor devices were stored at a high temperature for 200 hours in connection with the HTSL2, was determined as good (○), and other cases were determined as failure (×).

TABLE 1

|  |  | Example |  |  |  |  | Comparative Example |  |  |
|---|---|---|---|---|---|---|---|---|---|
| No. |  | 1 | 2 | 3 | 4 | 5 | 1 | 2 | 3 |
| Filler material | Fused spherical silica | 86.40 | 86.40 | 86.70 | 86.70 | 86.20 | 86.00 | 86.50 | 86.30 |
| Colorant | Carbon black | 0.30 | 0.30 | 0.30 | 0.30 | 0.30 | 0.30 | 0.30 | 0.30 |
| Coupling agent | C-1 | 0.25 | 0.25 | 0.25 | 0.25 | 0.25 | 0.25 | 0.25 | 0.25 |
|  | C-2 |  |  |  |  | 0.20 | 0.40 | 0.20 | 0.40 |
| Epoxy resin | BA-1 | 5.91 |  | 5.91 |  | 5.91 | 5.91 | 2.97 | 5.91 |
|  | BA-2 |  | 5.97 |  | 5.97 |  |  | 2.97 |  |
| Curing agent | HA-1 | 4.34 | 4.28 | 4.34 | 4.28 | 4.34 | 4.34 | 4.31 | 4.34 |
| Curing accelerator | A | 0.50 | 0.50 | 0.50 | 0.50 | 0.50 | 0.50 | 0.50 | 0.50 |
| Flame retardant | Aluminum hydroxide | 1.50 | 1.50 | 1.50 | 1.50 | 1.50 | 1.50 | 1.50 | 1.50 |
| Releasing agent | Carnauba wax | 0.50 | 0.50 | 0.50 | 0.50 | 0.50 | 0.50 | 0.50 | 0.50 |
| Neutralizing agent | Hydrotalcite | 0.30 | 0.30 |  |  | 0.30 | 0.30 |  |  |
|  | Total | 100.00 | 100.00 | 100.00 | 100.00 | 100.00 | 100.00 | 100.00 | 100.00 |
| SF | cm | 72 | 93 | 70 | 83 | 81 | 77 | 89 | 85 |
| GT | sec | 32 | 37 | 31 | 35 | 28 | 27 | 29 | 30 |
| Amount of corrosive gas (ppm) | $SO_2$ | 0.4 | 0.4 | 0.7 | 0.4 | 33 | 73 | 85 | 143 |
|  | HCl | 0.4 | 1.4 | 2.1 | 12.3 | 0.2 | 0.5 | 4.2 | 1.8 |
|  | Formic acid | 50 | 63 | 68 | 82 | 75 | 82 | 88 | 97 |
|  | Acetic acid | 40 | 44 | 52 | 56 | 72 | 75 | 71 | 71 |
|  | Total | 91 | 109 | 123 | 151 | 180 | 231 | 248 | 313 |
| HTSL1 (150° C.) | hr | >2000 | >2000 | >2000 | >2000 | >2000 | 834 | 335 | 632 |
| HTSL2 (175° C.) | hr | 1008 | 563 | 539 | 374 | 345 | 143 | 73 | 43 |
|  | Decision | ○ | ○ | ○ | ○ | ○ | × | × | × |

TABLE 2

|  |  | Example |  |  |  |  |  |  | Comparative Example |  |  |
|---|---|---|---|---|---|---|---|---|---|---|---|
| No. |  | 6 | 7 | 8 | 9 | 10 | 11 | 12 | 4 | 5 | 6 |
| Filler material | Fused spherical silica | 79.70 | 79.70 | 80.00 | 80.00 | 79.70 | 79.70 | 80.00 | 79.70 | 80.00 | 80.00 |
| Colorant | Carbon black | 0.30 | 0.30 | 0.30 | 0.30 | 0.30 | 0.30 | 0.30 | 0.30 | 0.30 | 0.30 |
| Coupling agent | C-1 | 0.25 | 0.25 | 0.25 | 0.25 | 0.25 | 0.25 | 0.25 | 0.25 | 0.25 | 0.25 |
|  | C-2 |  |  |  |  | 0.20 |  |  | 0.40 | 0.20 | 0.40 |
| Epoxy resin | BP-1 | 5.54 |  | 5.54 |  | 5.44 |  |  | 5.33 | 2.74 | 5.33 |
|  | BP-2 |  | 5.63 |  | 5.63 |  |  |  |  | 2.74 |  |
|  | BP-3 |  |  |  |  |  | 5.40 | 5.40 |  |  |  |
| Curing agent | HB-1 | 5.21 | 5.12 | 5.21 | 5.12 | 5.11 | 5.35 | 5.35 | 5.02 | 5.07 | 5.02 |
| Curing accelerator | B | 0.20 | 0.20 | 0.20 | 0.20 | 0.20 | 0.20 | 0.20 | 0.20 | 0.20 | 0.20 |
| Flame retardant | Aluminum hydroxide | 8.00 | 8.00 | 8.00 | 8.00 | 8.00 | 8.00 | 8.00 | 8.00 | 8.00 | 8.00 |
| Releasing agent | Carnauba wax | 0.50 | 0.50 | 0.50 | 0.50 | 0.50 | 0.50 | 0.50 | 0.50 | 0.50 | 0.50 |
| Neutralizing agent | Hydrotalcite | 0.30 | 0.30 |  |  | 0.30 | 0.30 |  | 0.30 |  |  |
|  | Total | 100.00 | 100.00 | 100.00 | 100.00 | 100.00 | 100.00 | 100.00 | 100.00 | 100.00 | 100.00 |
| SF | cm | 80 | 72 | 82 | 73 | 78 | 93 | 88 | 76 | 75 | 77 |
| GT | sec | 37 | 39 | 38 | 40 | 37 | 41 | 38 | 37 | 39 | 38 |
| Amount of corrosive gas (ppm) | $SO_2$ | 0.6 | 0.7 | 0.5 | 0.4 | 30 | 0.4 | 0.5 | 88 | 88 | 146 |
|  | HCl | 0.3 | 1.2 | 1.5 | 3.4 | 0.3 | 0.0 | 0.0 | 0.4 | 4.7 | 1.5 |
|  | Formic acid | 55 | 59 | 65 | 91 | 82 | 44 | 57 | 73 | 81 | 86 |
|  | Acetic acid | 36 | 38 | 48 | 57 | 74 | 32 | 42 | 93 | 74 | 75 |
|  | 計 | 92 | 99 | 115 | 152 | 186 | 76 | 100 | 254 | 248 | 309 |

TABLE 2-continued

| No. | | Example | | | | | | | Comparative Example | | |
|---|---|---|---|---|---|---|---|---|---|---|---|
| | | 6 | 7 | 8 | 9 | 10 | 11 | 12 | 4 | 5 | 6 |
| HTSL1 (150° C.) | hr | >2000 | >2000 | >2000 | >2000 | >2000 | >2000 | >2000 | 850 | 410 | 670 |
| HTSL2 (175° C.) | hr | 980 | 760 | 660 | 420 | 380 | 1200 | 920 | 130 | 100 | 80 |
| | Decision | ○ | ○ | ○ | ○ | ○ | ○ | ○ | x | x | x |

As shown in Tables 1 and 2, in the semiconductor devices having encapsulating resins by curing the epoxy resin compositions of Examples 1 to 12, failure did not occur even if the semiconductor devices were stored at a high temperature for 2000 hours in an environment at 150° C. Furthermore, when these semiconductor devices were stored in an environment at 175° C., failure did not occur even if the semiconductor devices were stored at a high temperature for 2000 hours. Therefore, it was found that when an epoxy resin composition in which the amount of generation of $SO_2$ generated when the cured product of the epoxy resin composition is heated for 10 hours at 200° C. is adjusted to less than or equal to 70 ppm, and the amount of generation of $SO_2$, hydrogen chloride (HCl), formic acid and acetic acid is adjusted to less than or equal to 230 ppm is used, the HTSL of a semiconductor device can be enhanced.

The invention claimed is:

1. An epoxy resin composition for semiconductor encapsulation, comprising an epoxy resin and a curing agent, said composition used for encapsulating a copper wire and a semiconductor element connected to the copper wire,
wherein a cured product of the epoxy resin composition for semiconductor encapsulation is heated for 10 hours at 200° C., the amount of generation of a first corrosive gas that is a sulfur compound having corrosiveness to the copper wire is less than or equal to 70 ppm, and
wherein the first corrosive gas is sulfurous acid gas.

2. The epoxy resin composition for semiconductor encapsulation according to claim 1, wherein a second corrosive gas that is a halogen compound, and a third corrosive gas that is an organic acid are corrosive to the copper wire, and the total amount of generation of the first, second and third corrosive gases generated when the cured product of the epoxy resin composition for semiconductor encapsulation is heated for 10 hours at 200° C. is less than or equal to 230 ppm.

3. The epoxy resin composition for semiconductor encapsulation according to claim 2, wherein the second corrosive gas is hydrogen chloride gas.

4. The epoxy resin composition for semiconductor encapsulation according to claim 2, wherein the third corrosive gas includes two or more kinds of different organic acids.

5. The epoxy resin composition for semiconductor encapsulation according to claim 2, wherein the third corrosive gas includes formic acid and/or acetic acid.

6. The epoxy resin composition for semiconductor encapsulation according to claim 1, further comprising hydrotalcite.

7. The epoxy resin composition for semiconductor encapsulation according to claim 6, wherein the hydrotalcite is a compound represented by the following formula (1):

$$M_aAl_b(OH)_{2a+3b-2c}(CO_3)_c \cdot mH_2O \quad (1)$$

wherein in the formula (1), M represents a metal element including at least Mg; a, b and c are respectively numbers that satisfy the relations: 2≤a≤8, 1≤b≤3, and 0.5≤c≤2; and m represents an integer of equal to or larger than 0.

8. The epoxy resin composition for semiconductor encapsulation according to claim 1, wherein the copper purity of the copper wire is more than or equal to 99.99% by mass.

9. A cured product of the epoxy resin composition for semiconductor encapsulation according to claim 1.

10. A semiconductor device comprising:
a lead frame having a die pad unit;
a semiconductor element mounted on the die pad unit;
a copper wire that electrically connects the lead frame and the semiconductor element; and
an encapsulating resin that is formed from a cured product of an epoxy resin composition and encapsulates the semiconductor element and the copper wire,
wherein when the encapsulating resin is heated for 10 hours at 200° C., the amount of generation of a first corrosive gas that is a sulfur compound having corrosiveness to the copper wire is less than or equal to 70 ppm, and
wherein the first corrosive gas is sulfurous acid gas.

11. The semiconductor device according to claim 10, wherein the second corrosive gas that is a halogen compound, and a third corrosive gas that is an organic acid have corrosiveness to the copper wire, and when the encapsulating resin is heated for 10 hours at 200° C., the total amount of generation of the first, second and third corrosive gases is less than or equal to 230 ppm.

12. The semiconductor device according to claim 10, wherein the copper wire is bonded to an electrode pad formed on the semiconductor element, and the electrode pad contains aluminum as a main component.

13. An epoxy resin composition for semiconductor encapsulation, comprising an epoxy resin and a curing agent, said composition used for encapsulating a copper wire and a semiconductor element connected to the copper wire,
wherein a cured product of the epoxy resin composition for semiconductor encapsulation is heated for 10 hours at 200° C.,
wherein the amount of generation of a first corrosive gas that is a sulfur compound having corrosiveness to the copper wire is less than or equal to 70 ppm, and
wherein the epoxy resin includes at least one selected from the group consisting of an epoxy resin represented by the following formula (2), an epoxy resin represented by the following formula (3), and an epoxy resin represented by the following formula (4):

wherein in the formula (2), $Ar^1$ represents a phenylene group or a naphthylene group; when $Ar^1$ is a naphthylene group, the glycidyl ether group may be bonded to any of the α-position and the β-position; $Ar^2$ represents any one group among a phenylene group, a biphenylene group and a naphthylene group; $R^5$ and $R^6$ each independently represent a hydrocarbon group having 1 to 10 carbon atoms; g represents an integer of 0 to 5; h represents an integer of 0 to 8; $n^3$ represents the degree of polymerization, and the average value is a positive number of 1 to 3;

(3)

wherein in the formula (3), a plurality of $R^9$ s each independently represent a hydrogen atom or a hydrocarbon group having 1 to 4 carbon atoms; and $n^5$ represents the degree of polymerization, and the average value thereof is a positive number of 0 to 4; and (4)

wherein in the formula (4), a plurality of $R^{10}$s and $R^{11}$s each independently represent a hydrogen atom or a hydrocarbon group having 1 to 4 carbon atoms; and $n^6$ represents the degree of polymerization, and the average value thereof is a positive number of 0 to 4.

14. An epoxy resin composition for semiconductor encapsulation, comprising an epoxy resin and a curing agent, said composition used for encapsulating a copper wire and a semiconductor element connected to the copper wire, wherein a cured product of the epoxy resin composition for semiconductor encapsulation is heated for 10 hours at 200° C., wherein the amount of generation of a first corrosive gas that is a sulfur compound having corrosiveness to the copper wire is less than or equal to 70 ppm, and wherein the epoxy resin composition comprises at least one curing agent selected from the group consisting of compounds represented by the following formula (5):

(5)

wherein in the formula (5), $Ar^3$ represents a phenylene group or a naphthylene group;

when $Ar^3$ is a naphthylene group, the hydroxyl group may be bonded to any of the α-position and the β-position; $Ar^4$ represents any one group among a phenylene group, a biphenylene group and a naphthylene group; $R^7$ and $R^8$ each independently represent a hydrocarbon group having 1 to 10 carbon atoms; i represents an integer of 0 to 5; j represents an integer of 0 to 8; $n^4$ represents the degree of polymerization, and the average value is a positive number of 1 to 3.

* * * * *